(12) United States Patent
Larsen et al.

(10) Patent No.: US 8,955,693 B2
(45) Date of Patent: Feb. 17, 2015

(54) FILLER PANEL FOR EQUIPMENT RACKS AND ENCLOSURES

(75) Inventors: Lars R. Larsen, Old Lyme, CT (US); Chris M. Vacca, Westerly, RI (US); Robert R. Adams, Johnston, RI (US)

(73) Assignee: Ortronics, Inc., New London, CT (US)

( * ) Notice: Subject to any disclaimer, the term of this patent is extended or adjusted under 35 U.S.C. 154(b) by 366 days.

(21) Appl. No.: 12/905,298

(22) Filed: Oct. 15, 2010

(65) Prior Publication Data

US 2012/0091090 A1 Apr. 19, 2012

(51) Int. Cl.
*A47F 7/00* (2006.01)
*H02G 3/04* (2006.01)
*H05K 7/18* (2006.01)

(52) U.S. Cl.
CPC .............. *H02G 3/0418* (2013.01); *H05K 7/18* (2013.01)
USPC ....................................................... 211/26

(58) Field of Classification Search
CPC ... H05K 7/1425; H05K 7/1461; H05K 7/183; H05K 7/186; H05K 7/1424; H05K 9/0062; H05K 5/023; G06F 1/183
USPC .......... 211/26, 183; 312/236, 265.6; 361/724, 361/727; 174/66, 67; 454/186
See application file for complete search history.

(56) References Cited

U.S. PATENT DOCUMENTS

| | | | |
|---|---|---|---|
| 5,897,180 A | 4/1999 | Singer | |
| 6,616,005 B1 * | 9/2003 | Pereira et al. | 220/241 |
| 6,695,149 B1 * | 2/2004 | Cote et al. | 211/26 |
| 6,967,279 B2 * | 11/2005 | Cerniglia et al. | 174/377 |
| 7,500,863 B2 | 3/2009 | Ringler et al. | |
| 7,506,768 B2 | 3/2009 | Rassmussen et al. | |
| 7,875,799 B2 | 1/2011 | Fransen et al. | |
| 7,881,074 B2 | 2/2011 | Lakoduk et al. | |
| 8,052,231 B2 * | 11/2011 | Rasmussen et al. | 312/265.6 |
| 8,262,041 B2 * | 9/2012 | Bergesch | 248/220.43 |
| 2002/0153338 A1 * | 10/2002 | Orr | 211/183 |
| 2006/0005988 A1 | 1/2006 | Jorgensen | |
| 2008/0310126 A1 * | 12/2008 | Lakoduk et al. | 361/731 |
| 2009/0167127 A1 * | 7/2009 | Chen et al. | 312/334.1 |
| 2009/0178985 A1 | 7/2009 | Sempliner et al. | |

OTHER PUBLICATIONS

Extended European Search Report from corresponding parent EP 1871156 dated Mar. 22, 2011.
PCT International Search Report and Written Opinion dated Feb. 1, 2012.

* cited by examiner

*Primary Examiner* — Patrick Hawn
(74) *Attorney, Agent, or Firm* — McCarter & English, LLP (57) ABSTRACT

A filler panel for a rack includes two latching regions that mirror each other. The latching regions include a pair of guide posts configured to enter both round-shaped and square-shaped holes and guide the filler panel into a rack. The latching region further includes a pair of locator walls configured to enter square shaped holes along with the guide posts to guide the filler panel into a rack. Each latching region includes one or more latching members having surfaces for engaging a railing of a rack. At least one pair of latching members includes an angled stepped surface configured to engage railings of different thicknesses.

16 Claims, 8 Drawing Sheets

FILLER PANEL FOR EQUIPMENT RACKS AND ENCLOSURES

BACKGROUND

1. Technical Field

The present disclosure relates generally to rack- or enclosure-mounted devices and, more particularly, to filler panels that are adapted to be detachably mounted with respect to a rack, cabinet or like structure.

2. Background

Cable management systems (such as cable racks, bays or frames, which are hereinafter referred to as "racks") have long been used in many varied applications, such as in communications and electronic services. Racks are substantially rectilinear metal frames with several vertical railings, each provided with a plurality of mounting and alignment openings or holes that permit mounting of various devices. It is generally desirable to place a filler panel (also known as a blanking panel) to cover empty space in a rack. The use of a filler panel may be for aesthetic reasons, security reasons and/or to guide airflow through the components positioned on or in the rack for cooling purposes. To improve efficiency, it is desirable to provide a filler panel that is easy to install and that may be used in connection with various racks and rack designs.

The Electronic Industries Association ("EIA") has promulgated standards for various dimensions of racks. These standards have allowed manufacturers to produce devices with standardized dimensions that can fit into any EIA compliant rack. Although these standardizations have improved interchangeability of devices between different racks, certain elements of racks have not been standardized. For example, the holes that are formed in the railings of a rack may be round, square and/or threaded. The thickness or depth of the railings in a rack may also vary, e.g., due to the use of different metal thicknesses in the manufacturing process. When manufacturing filler panels for racks, it is generally desirable to provide filler panels that can be used in a variety of racks, e.g., regardless of railing depth/thickness. It is further desirable to provide filler panels that can be removed from one rack and mounted in a different rack, i.e., are interchangeable from one rack to another, both initially and repeatedly after initial deployment.

U.S. Patent Publication No. 2008/0310126 to Lakoduk et al. (Hoffman Enclosures, Inc.) discloses a blanking panel which includes a first pin and a second removable pin. The pins are configured such that the main body of the panel can be alternatively attached to a square-shaped hole with the removable pin intact, or attached to a round-shaped hole with the removable pin removed and the first pin extending through the hole. The blanking panel of Hoffman Enclosures, however, fails to allow a removed pin to be reattached for interchangeable use of the filler panel in a railing with square-shaped holes.

U.S. Pat. No. 7,506,768 to Rassmussen et al. (American Power Conversion Corporation) discloses a blanking panel for use with equipment racks/enclosures that is adapted to be mounted with respect to a pair of vertical mounting rails or flanges of a rack or enclosure without the use of tools or other hardware. When the blanking panel is installed into a rack or enclosure, portions of a body of the blanking panel interface with a surface of an equipment component or another blanking panel installed above or below the blanking panel to thereby form an air seal therebetween.

Despite efforts to date, a need exists for an easy to install filler panel capable of engaging a variety of racks interchangeably. These and other disadvantages and/or limitations are addressed and/or overcome by the devices and methods of the present disclosure.

BRIEF DESCRIPTION OF THE DRAWINGS

To assist those of ordinary skill in the art in making the disclosed filler panels, system and methods, reference is made to the appended figures, wherein.

SUMMARY

The present disclosure describes filler panels that can be interchangeably mounted in EIA racks with differing railing thickness and hole shapes. In an exemplary embodiment, the filler panel includes a pair of latching members disposed on opposing sides of the filler panel that have an angled stepped surface configured to engage a plurality of railings. A pair of guide posts and locator walls are disposed adjacent each latching member and are configured to guide the filler panel on to a rack.

Thus, according to exemplary embodiments of the present disclosure, a filler panel is provided characterized by a panel body that includes, inter alia, (i) two or more latching members, each defining a hood portion, wherein each hood portion includes an angled, stepped latching surface; (ii) two or more guide towers; and (iii) two or more locator walls. The angled, stepped latching surfaces of the hood portion are generally disposed relative to the panel body so as to securely and detachably engage a plurality of racks that are characterized by differing depth dimensions. The two or more guide towers are typically configured to enter holes associated with a railing and to guide the latching member to engage the railing. Of note, the two or more locator walls and the two or more guide towers may be configured to enter holes of varying geometries.

According to exemplary embodiments, the angled, stepped latching surfaces associated with the hood portions of the latching members may define a plurality of stepped surfaces, e.g., two stepped surfaces. The hood portion may defines an angle of between about 45 degrees and 60 degrees relative to the x-axis defined by the panel body. The filler panel of claim 1, wherein the distance between each of the respective latching members and the respective guide posts is sufficient to allow said latching member to securely engage the railing of a rack. The panel body may further define finger hold(s) and/or stiffening rib(s). In addition, the panel body further defines a removable insert region that is adapted to receive a component, e.g., a camera, temperature monitor, patch panel, etc.

The present disclosure further provides advantageous methods for detachably engaging a filler panel with respect to a railing of a rack. In one such method, the steps include (a) providing a filler panel that includes (i) two or more latching members, each defining a hood portion, wherein each hood portion includes an angled, stepped latching surface; (ii) two or more guide towers; and (iii) two or more locator walls; (b) aligning the guide towers of the filler panel with holes defined in the railing; and (c) applying a force sufficient to detachably engage the latching member of the filler panel with respect to the railing. In applying the noted force, the angled stepped surface associated with at least one hood portion advantageously engages the railing of the rack. The filler panel may be removed from the rack by, e.g., applying a force to a finger hold associated with the filler panel sufficient to remove the filler panel from the rack.

In a still further embodiment of the present disclosure, a latching member for a filler panel is provided that includes an angled stepped surface having at least a first stepped surface and a second stepped surface separated from the first stepped surface by a slot; wherein each of the first and second stepped surfaces is adapted to detachably engage a railing associated with a rack of different thickness dimension. A third latch member may be provided that is separated from the second latch member by a second slot, the third latch member defining a third angled, stepped surface that is substantially the same as the first angled, stepped surface defined by the first latch member.

Additional features, functions and structural aspects of the disclosed filler panels and associated systems and methods will be apparent from the detailed description which follows, particularly when read in conjunction with the accompanying figures.

DETAILED DESCRIPTION OF EXEMPLARY EMBODIMENT(S)

The present disclosure provides advantageous filler panels that are configured to be mounted interchangeably and detachably into a variety of racks. The filler panels of the present disclosure may be advantageously sized to function in cooperation with conventional EIA rack structures, e.g., 19" and 23" racks.

Figure 1:
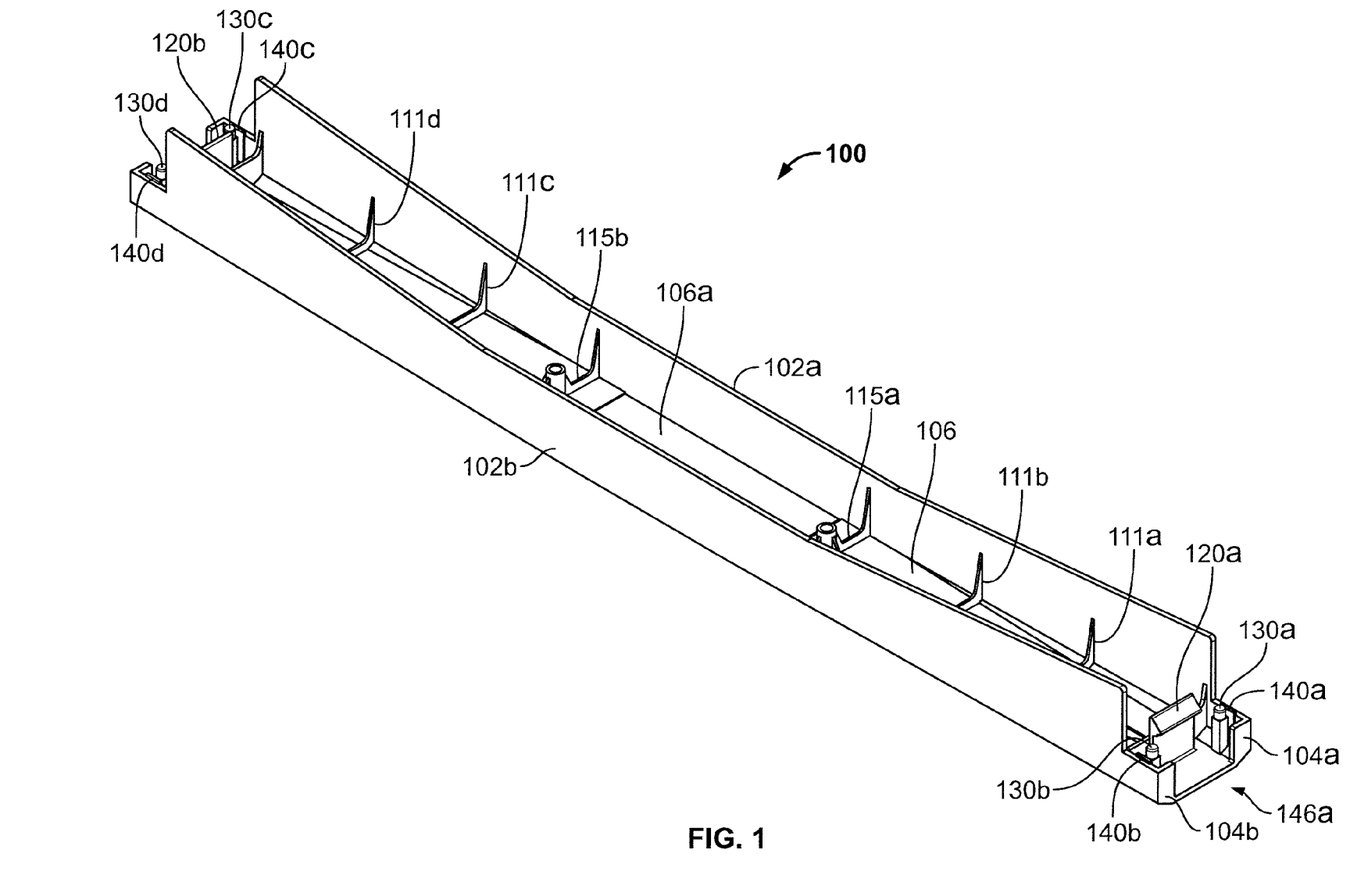
FIG. 1 is a schematic perspective view of an exemplary filler panel according to the present disclosure.
Figure 2:
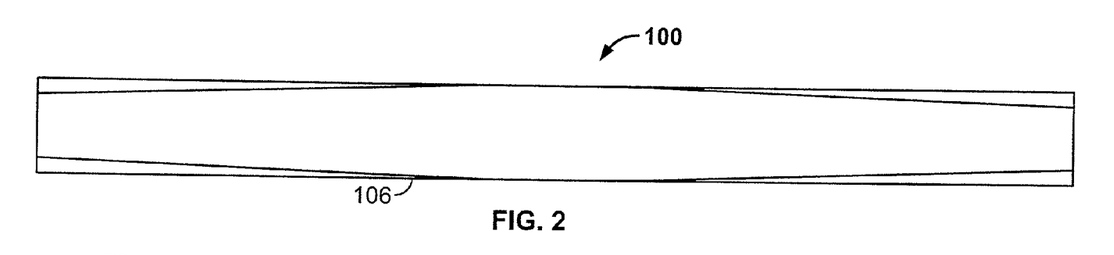
FIG. 2 is a front view of the exemplary filler panel of FIG. 1.
Figure 3:
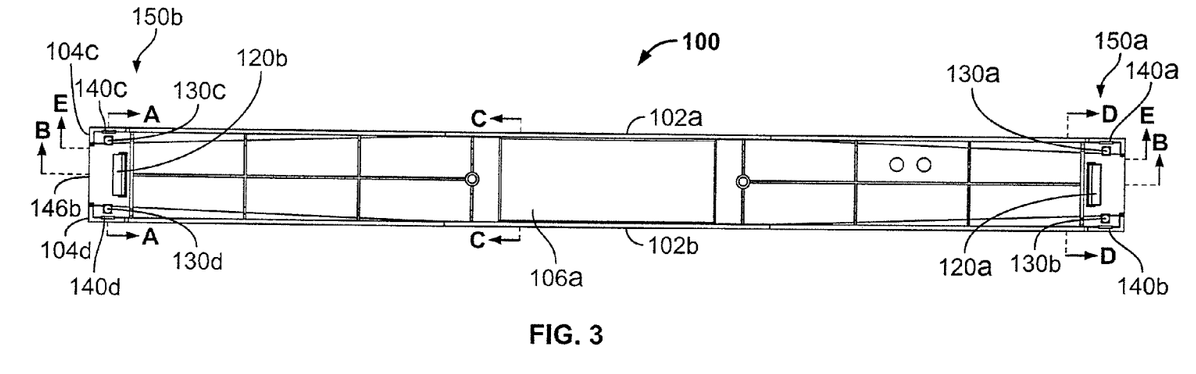
FIG. 3 is a top schematic view of the exemplary filler panel of FIG. 1.

With reference to FIGS. 1-3, a first exemplary filler panel 100 of the present disclosure is depicted. Filler panel 100 includes first sidewall 102a, second sidewall 102b, front wall 106 and end walls 104a-104d. Defined on opposing ends of the filler panel 100 are latching regions 150a and 150b configured to securely and detachably engage the railings of a rack. Latching region 150a includes latching member 120a, first guide post 130a, second guide post 130b, first locator wall 140a, second locator wall 140b, first end wall 104a, and second end wall 104b. End walls 104a and 104b further define a finger hold 146a on a portion of front wall 106. Disposed on front wall 106 are a plurality of supporting ribs 111a-111d. Further disposed on front wall 106 are first boss 115a and second boss 115b. Latching region 150b mirrors latching region 150a and includes latching member 120b, guide posts 130c and 130d, and locator walls 140c and 140d. Similarly, end walls 104c and 104d define a second finger hold 146b on front wall 106. Further defined on front wall 106 is portion 106a. In some embodiments, portion 106a may be removed to accommodate an optional device, such as a temperature monitoring device, a camera, a patch panel or the like.

Figure 4:
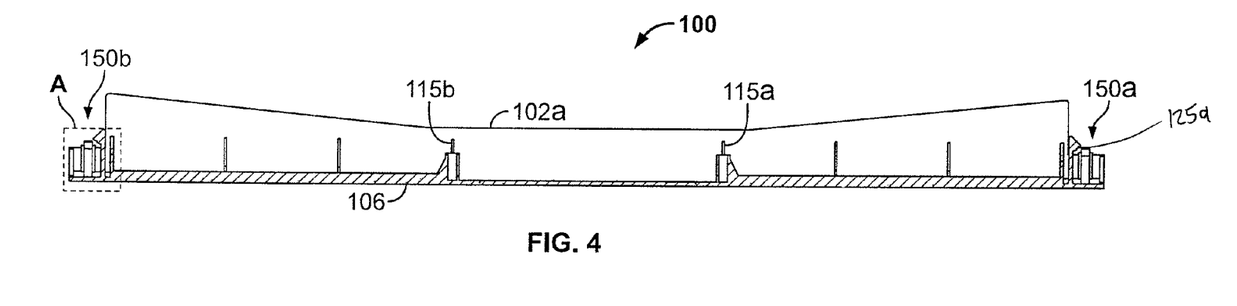
FIG. 4 is a cross-sectional view along the line E-E of FIG. 3.
Figure 5:
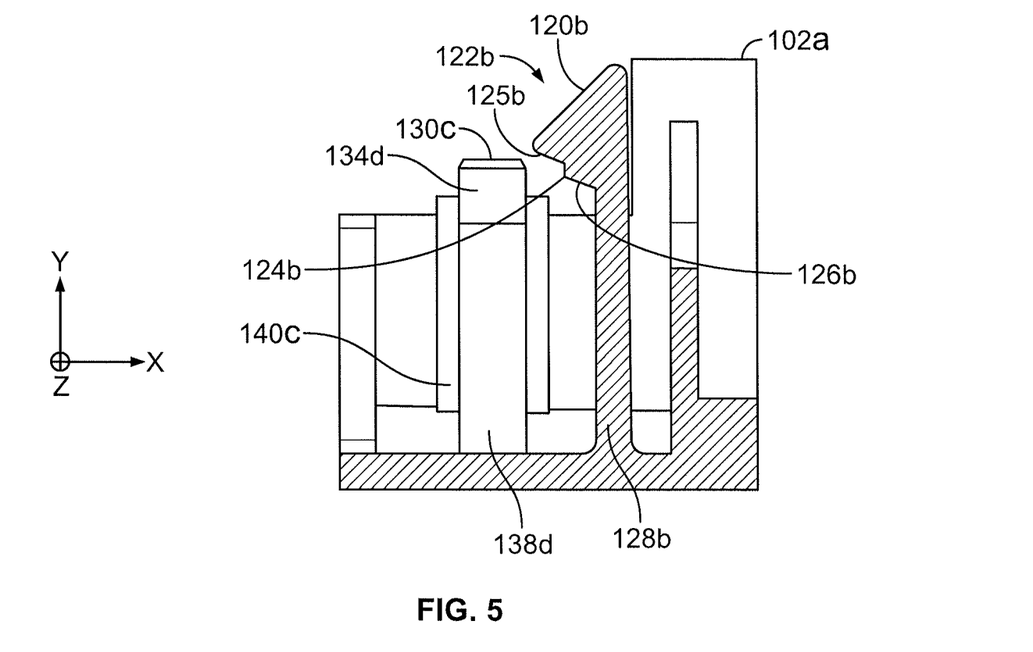
FIG. 5 is an enlarged view of the box A of FIG. 4.

Turning to FIGS. 4 and 5, a detailed view of exemplary latching portion 150b is depicted. FIG. 4 is a cross-sectional view of filler panel 100 taken along the line B-B of FIG. 3. FIG. 5 is an enlarged view of latching portion 150b focused on the region enclosed in square A of FIG. 4. Latching member 120b includes a hood portion 122b and stem portion 128b. Hood portion 122b has a substantially triangular cross section. Hood portion 122b includes angled, stepped surface 124b. Angled stepped surface 124b includes first stepped surface 125b and second stepped surface 126b. Stepped surfaces 125b and 126b may be angled to rise from the x-axis. In use, one of a pair of angled stepped surfaces 125a and 125b (or 126a and 126b), engages the railings of a rack with sufficient force to detachably, yet securely retain the filler panel 100 in position relative to the rack. Those skilled in the art will recognize that the rise between stepped surfaces 125b and 126b may be varied to facilitate engagement of the latching member 120b with respect to railings of different thicknesses.

Those of skill in the art will further recognize that, by varying the angle that hood portion 122b makes with the x-axis, the force with which the latching member 120b engages the railings of a rack (and conversely, the force required to detach latching member 120b from the railings of a rack) may be varied. In some embodiments, the angle defined between the hood portion 122b and the x-axis may be approximately 45 degrees. In other embodiments, the angle defined between the hood portion 122b and the x-axis may be approximately 60 degrees. In some embodiments, angled stepped surfaces 124a and 124b may be configured to include more than two stepped surfaces.

Figure 7:
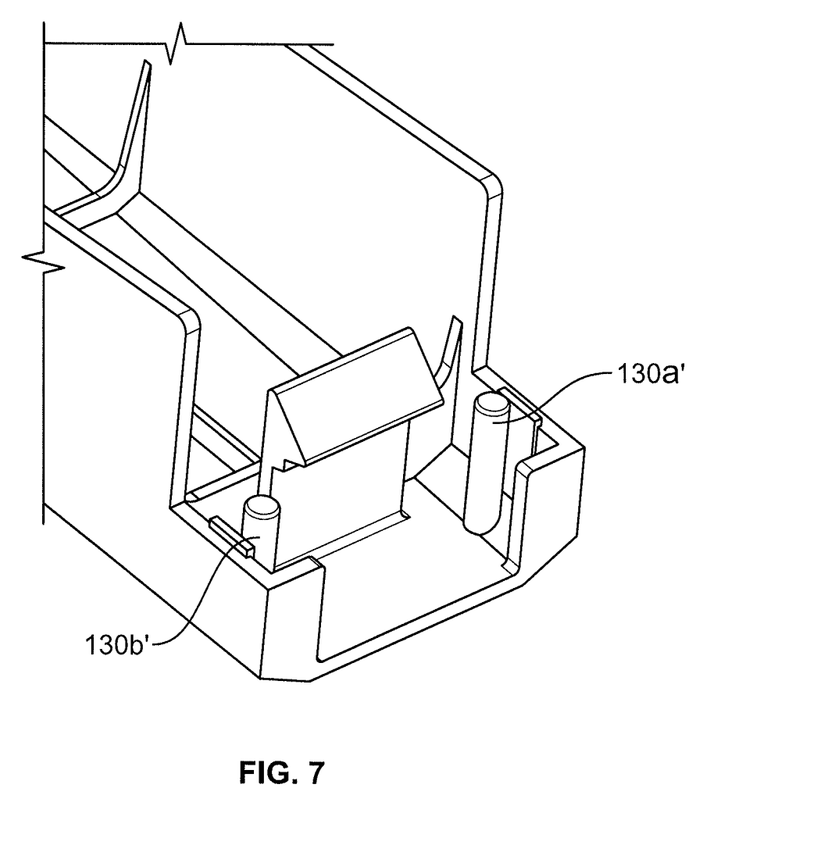
FIG. 7 is an enlarged view of the latching portion of another exemplary filler panel according to the present disclosure.

Referring again to FIGS. 1-5, guide posts 130a-130d include a substantially rectangular box base portion 138a-138d and a substantially cylindrical top portion 134a-134d. Guide posts 130a-130d may be substantially identical in shape and size. The diameter of cylindrical top portions 134a-134d is smaller than the diameter of the screw holes in the railings of EIA approved racks. The cylindrical portions 134a-134d are configured to enter holes in railings to guide the filler panel 100 onto the railings as the latching members 120a and 120b engage the railings. The distance between latching members 120a-120b and guide posts 130a-130d is chosen to ensure latching members 120a and 120b securely engage the surface of a railing. In an alternate embodiment depicted in FIG. 7, guide posts 130a'-130b' are substantially cylindrical. Guide posts 130a-130d may be constructed of a metal or plastic by any manner known in the art including molding and stamping.

Still referring to FIGS. 1-5, locator walls 140a-140d have a substantially rectangular cross-section. Locator walls 140a-140d may be substantially identical to each other in size and shape. Locator walls 140a-140d are positioned to abut sidewalls 102a and 102b. Locator walls 140a-140d are configured to enter square-shaped holes in a railing along with guide posts 130a-130d to guide the filler panel 100 on to the railing as latching members 120a and 120b engage the railing. When filler panel 100 is placed in a rack with round-shaped holes, the locator walls 140a-140d act as an offset from the railing. The height of the locator walls 140a-140d extend above walls 102a and 102b is chosen to ensure that locator walls 140a-140d do not interfere with the retention of the railing by latching members 120a and 120b. In order to enter the square holes of a railing, the length of locator walls 140a-140d along the x-axis is chosen to be less than the length of the sides of square-shaped holes found in EAI racks. Locator walls 140a-

140d may be constructed of a metal or plastic by any manner known in the art including molding and stamping.

Figure 6:
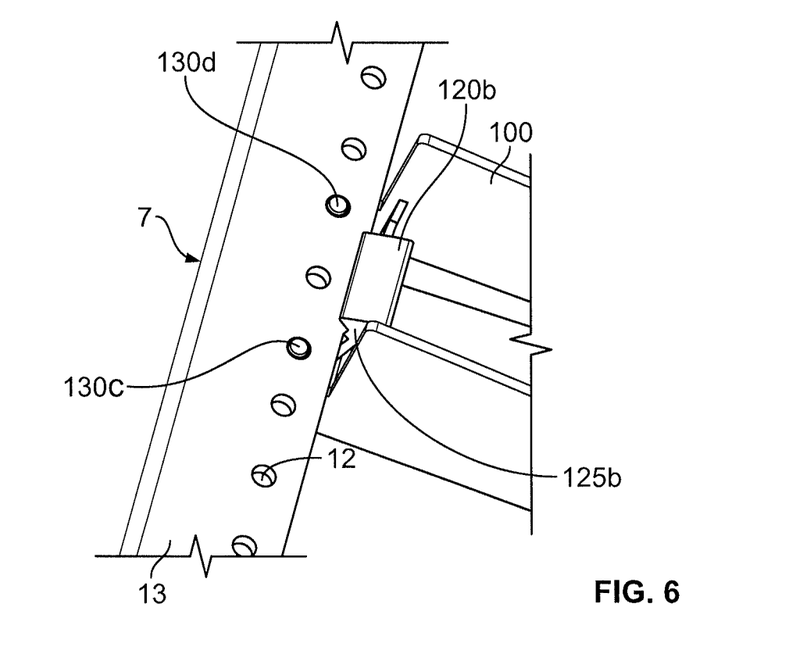
FIG. 6 is an enlarged view of the exemplary filler panel of FIG. 1 mounted in a rack.

Turning to FIG. 6, an enlarged view of filler panel 100 engaging railing 13 of rack 7 is depicted. Rack 7 includes railings having substantially round-shaped holes 12. With further reference to FIGS. 1 and 5, the installation of filler panel 100 onto rack 7 is described. In operation, an installing technician holds filler panel 100 at finger holds 146a and 146b to position guide posts 130a-130d into the round-shaped holes 12. Once positioned, the technician pushes filler panel 100 into the rack 7. The force applied by the technician is sufficient to cause latching members 120a and 120b to flex towards the center of the filler panel 100 until stepped surface 125b engages the railing 13. Finger holds 146a and 146b are similarly used to remove the filler panel 100 from rack 7. Pulling the filler panel 100, disengages the latching members 120a and 120b to remove the filler panel 100 from rack 7. The latching members 120a and 120b of filler panel 100 are configured to be easily removable from a rack. Latching members 120a and 120b may be constructed of any material that allows the latching members 120a and 120b to flex and engage a railing. Latching members 120a and 120b, guide posts 130a-130d and locator walls 140a-140d may be attached to front wall 106 by any means know in the art.

Turning to FIGS. 8-11, an alternative exemplary filler panel 200 according to the present disclosure is schematically depicted. The structure of filler panel 200 is substantially similar to filler panel 100, except that filler panel 200 has more than one latching member located in each latching region 250a and 250b. Latching regions 250a and 250b are mirror images of each other. As shown in more detail in FIG. 9, latching region 250a includes a first latching member 260a, a second latching member 260b, and an intermediate latching member 260c. First latching member 260a is separated from intermediate latching member 260c by slot 223a, and intermediate latching member 260c is separated from second latching member 260b by slot 223b. The noted slots 223a, 223b allow each of latching members 260a, 260b, 260c to operate substantially independently.

Figure 9:
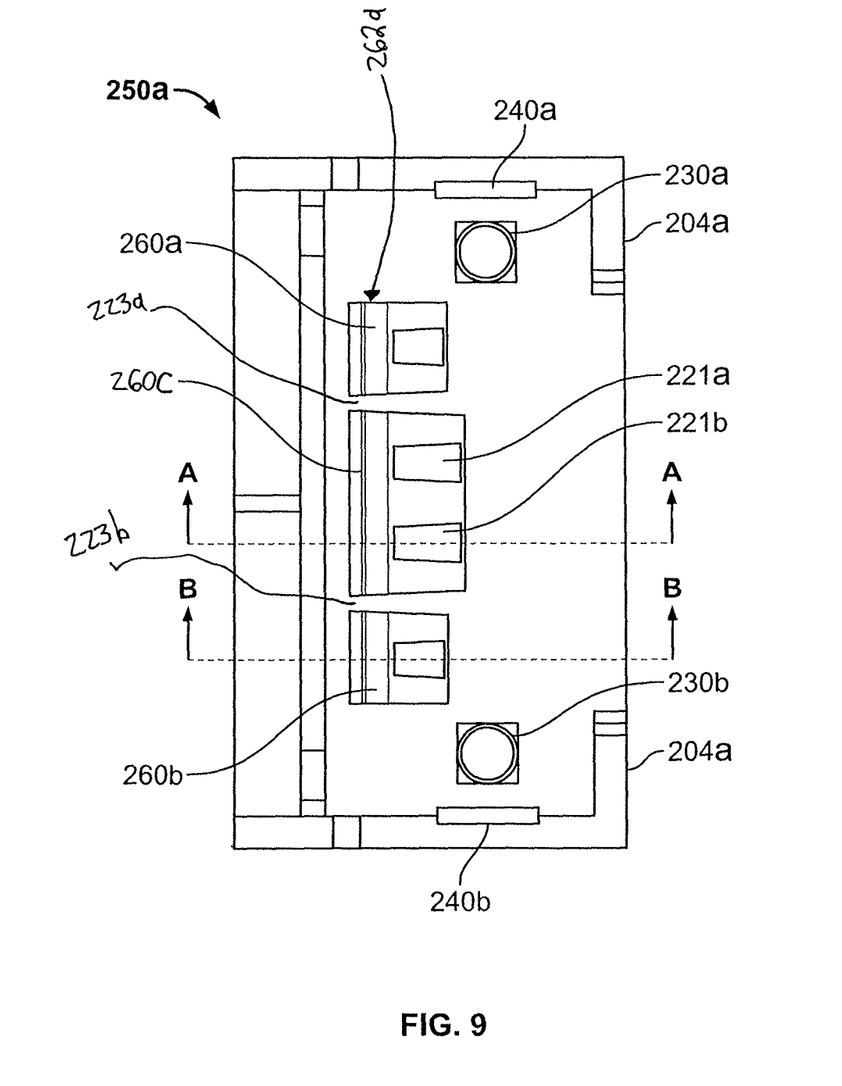
FIG. 9 is an enlarged top schematic view of a latching portion of FIG. 8.

According to exemplary embodiments of the present disclosure, first latching member 260a and second latching member 260b define a first angled step for latching purposes, whereas intermediate latching member 260c defines a distinct angled step, such that first and second latching members 260a, 260b are adapted to engage a railing of a first depth dimension and intermediate latching member 260c is adapted to engage a railing of a second depth dimension. According to this exemplary implementation, the latching forces of first and second latching members 260a, 260b is additive and substantially balanced so as to avoid potential torquing relative to the rack. In exemplary implementations of filler panel 200, the latching surface of intermediate latching member 260c may be approximately equal (or at least of comparable dimension) to the cumulative latching surface of first and second latching members 260a, 260b. Advantageously, the use of more than one latching member allows the filler panel 200 to engage a larger number of variable thickness railings.

Figure 10:
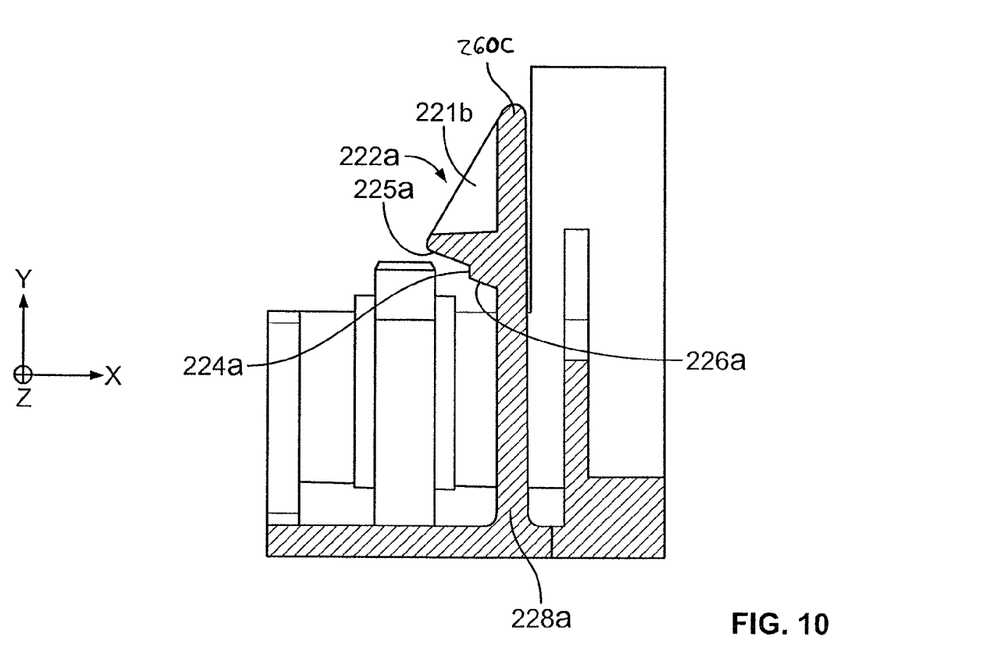
FIG. 10 is a cross-sectional view along the line A-A of FIG. 9.

With reference to FIG. 10, a cross-sectional view taken along line A-A of FIG. 9 is depicted. Latching member 260c includes hood portion 222a and stem portion 228a. Hood portion 222a has a substantially triangular cross-section and includes angled stepped surface 224a. Angled stepped surface 224a includes a first stepped surface 225a and a second stepped surface 226a configured to engage a railing. With further reference to FIG. 9, hood portion 222a may include core cavities 221a and 221b. Those skilled in the art will recognize that core cavities of varying size may be included into any of the exemplary embodiments of a latching member disclosed herein without impacting the functionality of the latching member.

Figure 11:
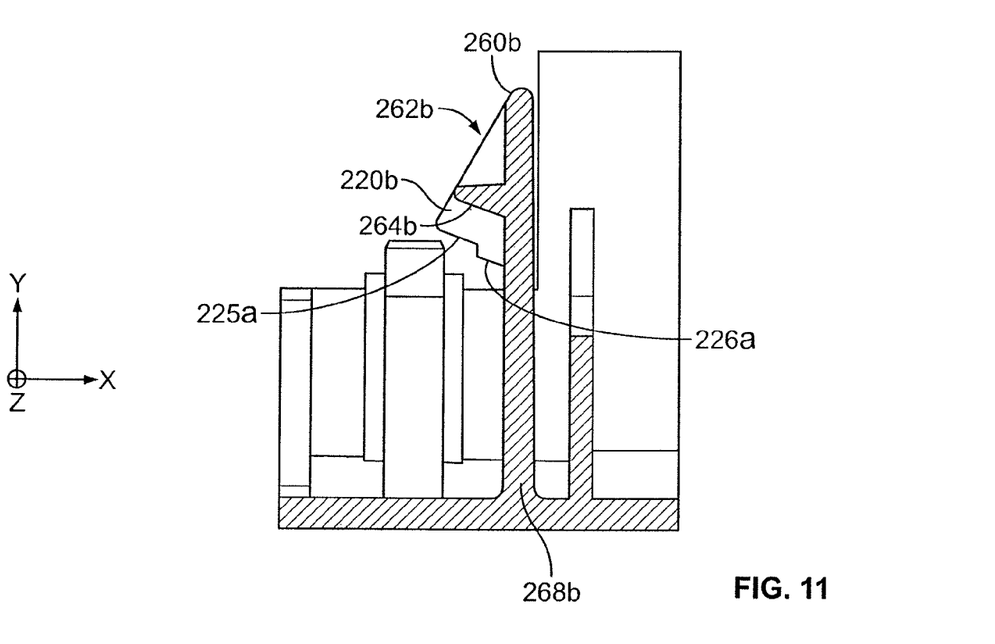
FIG. 11 is a cross-sectional view along the line B-B of FIG. 9.

Turning now to FIG. 11, a cross-sectional view taken along line B-B of FIG. 9 is illustrated. Second latching portion 260b includes a hood portion 262b and a stem portion 268b. Hood portion 262b includes angled surface 264b. Angled surface 264b is configured to engage a railing of a rack. Angled surface 264b lies in a different plane on the y-axis from the planes of stepped surfaces 225a and 226a of latching member 260c. Surface 264b may be angled to rise from the x-axis. Advantageously, the disclosed latching members associated with filler panel 200 allow filler panel 200 to interchangeably and detachably engage railings of different thicknesses, because any of the stepped surface of the latching members 260c-260c' or 260a, 260b, 260a', 260b' (not pictured) may engage the railing depending on the railing thickness thereof.

Figure 8:
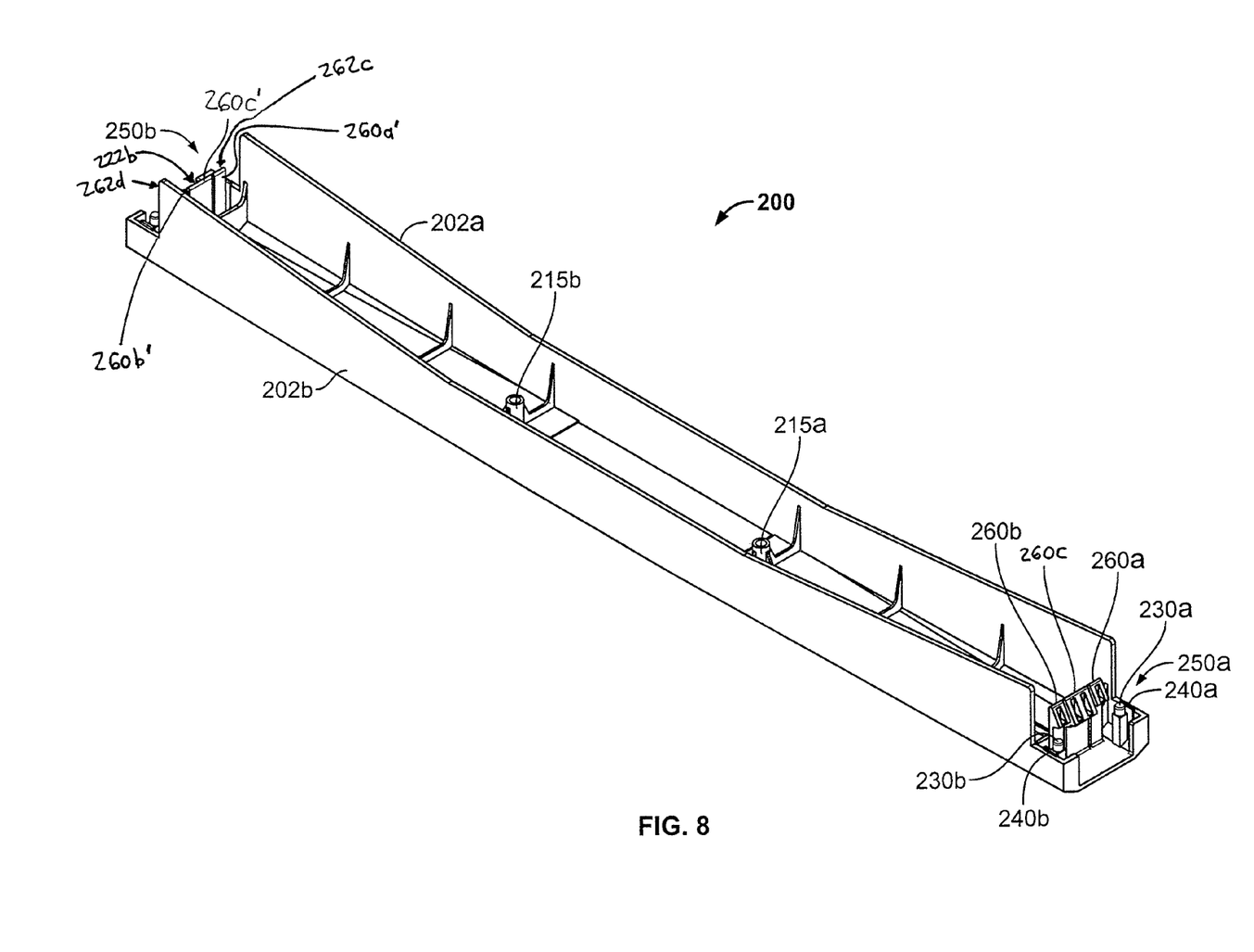
FIG. 8 is a schematic perspective view of another exemplary filler panel according to the present disclosure.
Figure 12:
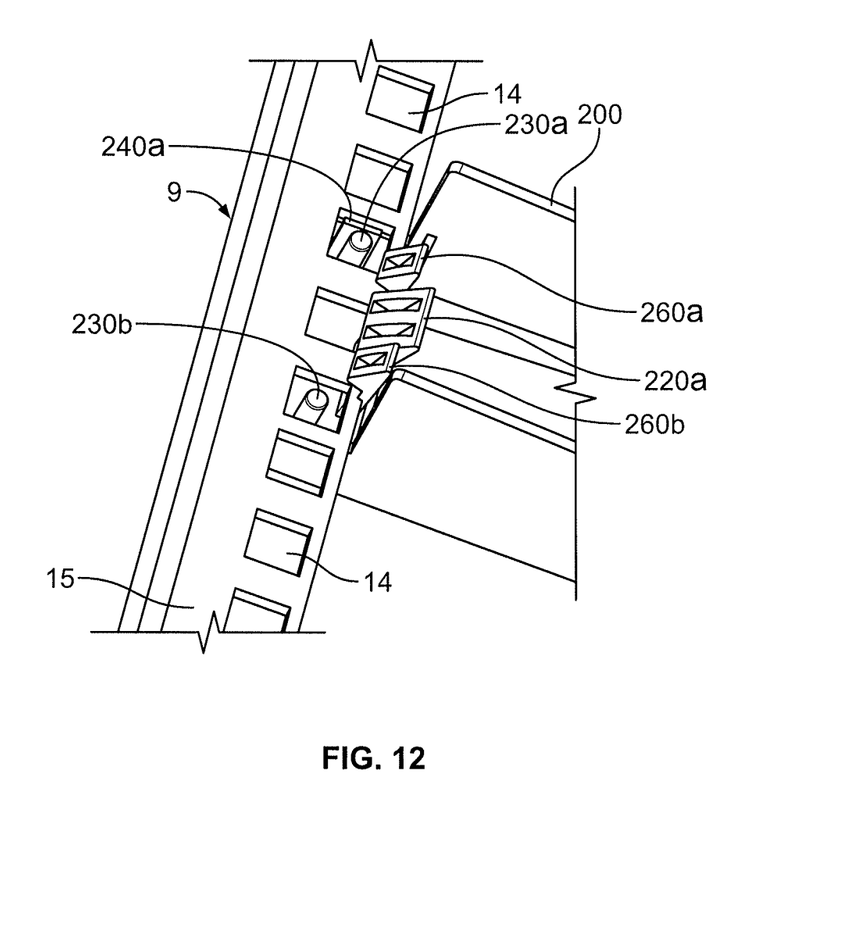
FIG. 12 is an enlarged view of the exemplary filler panel of FIG. 9 mounted in a rack.

Turning to FIG. 12, an enlarged view of filler panel 200 engaging railing 15 of a rack 9 is depicted. Railing 15 includes substantially square-shaped holes 14. With further reference to FIGS. 8, 10 and 11, the installation of filler panel 200 onto rack 9 is described. In operation, an installing technician holds filler panel 200 at finger holds 246a and 246b to position guide posts 230a-230d and locator walls 240a-240d into the square-shaped holes 14. Once positioned, the technician pushes filler panel 200 into the rack 9. The force applied by the technician is sufficient to cause hood portions 222a-222b of latching members 260c and 260c' and hood portions 262a-262d of first and second latching members 260a, 260a', 260b, 260b' to flex towards the center of filler panel 200 until the cooperative angled surfaces of the appropriate latching members engage the railing 15. To remove filler panel 200 from rack 9, a technician holds filler panel 200 at finger holds 246a and 246b and pulls the filler panel 200 to disengage the latching members from the rack 9. The disclosed latching members may be constructed of any material that allows sufficient flexibility to engage a railing. The latching members, guide posts and locator walls may be integrally formed or separately fabricated and then attached to front wall 206 by any means know in the art.

As will be readily apparent to persons skilled in the art, exemplary filler panels 100 and 200 described herein advantageously allow for interchangeable and detachable mounting of filler panels with respect to racks. In exemplary embodiments, the filler panels include guideposts configured to enter both round-shaped holes and squared shaped holes in a railing. In further exemplary embodiments, the filler panels include locator walls configured to enter squared-shaped holes along with the guide posts. When used with racks having round-shaped holes, the locator walls act as offsets from railings. In addition, the disclosed filler panels may advantageously include one or more pairs of identical latching members disposed at opposing sides of the filler panel to securely engage the surface of a railing. Each pair of latching members may include one or more stepped surfaces configured to engage a railing. Advantageously, the filler panels of the present disclosure may be mounted in a rack having round, square or threaded holes without removing any portion of the filler panel. Furthermore, once installed, a filler panel may be removed from one rack and placed in a rack with different hole shapes and railing thicknesses.

Although the present disclosure has been described with reference to exemplary embodiments and implementations, it is to be understood that the present disclosure is neither limited by nor restricted to such exemplary embodiments and/or implementations. Rather, the present disclosure is susceptible to various modifications, enhancements and variations without departing from the spirit or scope of the present disclosure. Indeed, the present disclosure expressly encompasses such modifications, enhancements and variations as will be readily apparent to persons skilled in the art from the disclosure herein contained.

What is claimed is:

1. A filler panel, comprising:
a panel body that includes: (i) two or more latching members, each defining a hood portion, wherein each hood portion includes an angled, stepped latching surface, (ii) two or more guide posts, and (iii) a permanent and non-removable locator wall positioned proximal to and spaced from each guide post by an open slot, each permanent and non-removable locator wall fixedly attached to the panel body;
wherein each guide post has a top portion that extends further from the panel body than its proximal locator wall extends from the panel body;
wherein the angled, stepped latching surface associated with each hood portion defines a plurality of stepped surfaces;
wherein the top portion of each guide post is configured to enter and fill a round hole associated with a first railing and guide at least one of the latching members to engage the first railing while its proximal locator wall cannot enter the same respective round hole;
wherein a second railing defines a plurality of square holes; and
wherein after each guide post has entered a round hole associated with the first railing and thereafter removed from each respective round hole, then each permanent and non-removable locator wall and its proximal guide post are both configured to enter the same respective square hole defined in the second railing and to guide at least one of the latching members to engage the second railing.

2. The filler panel of claim 1, wherein the plurality of stepped surfaces of each hood portion includes at least a first stepped surface and a second stepped surface;
wherein the first stepped surface of each hood portion is capable of securely and detachably engaging the first railing;
wherein the second stepped surface of each hood portion is capable of securely and detachably engaging the second railing; and
wherein the mounting rail thickness of the first railing is different than the mounting rail thickness of the second railing.

3. The filler panel of claim 1, wherein the top portion of each guide post is cylindrical; and
wherein each guide post includes a rectangular base portion, with its cylindrical top portion extending from the rectangular base portion.

4. The filler panel of claim 1, wherein each hood portion defines an angle of between about 45 degrees and 60 degrees relative to the x-axis defined by the panel body.

5. The filler panel of claim 1, wherein the angled stepped latching surfaces associated with each hood portion rises about 20 degrees from the x-axis defined by the panel body.

6. The filler panel of claim 1, wherein the panel body further defines at least one finger hold; and
wherein the panel body further defines one or more stiffening ribs.

7. The filler panel of claim 3, wherein the cylindrical top portion of each of the two or more guide posts is configured to enter a round hole associated with the first railing and guide at least one of the latching members to engage the first railing having the round holes; and
wherein each permanent and non-removable locator wall and the rectangular base portion of the guide post proximal to each permanent and non-removable locator wall is configured to enter the same respective square hole defined in the second railing and guide at least one of the latching members to engage the second railing having the square holes.

8. The filler panel of claim 1, wherein the panel body further defines a removable insert region.

9. A method for detachably engaging a filler panel comprising the steps of:
providing a first rack, the first rack defining a plurality of holes that are round;
providing a panel body that includes: (i) two or more latching members, each defining a hood portion, wherein each hood portion includes an angled, stepped latching surface that defines a plurality of stepped surfaces, (ii) two or more guide posts, and (iii) a permanent and non-removable locator wall positioned proximal to and spaced from each guide post by an open slot, each permanent and non-removable locator wall fixedly attached to the panel body, and each guide post having a top portion that extends further from the panel body than its proximal locator wall extends from the panel body;
aligning the top portion of each guide post with a respective round hole defined in a first rack so that the top portion of each guide post enters and fills a round hole of the first rack while its proximal locator wall cannot enter the same respective round hole;
applying a force sufficient to detachably engage the latching members of the panel body with respect to the first rack;
detaching the latching members from the first rack;
providing a second rack, the second rack defining a plurality of holes that are square;
aligning each permanent and non-removable locator wall and its proximal guide post with a respective square hole defined in the second rack so that each locator wall and its proximal guide post enter the same respective square hole; and
applying a force sufficient to detachably engage the latching members of the panel body with respect to the second rack.

10. The method of claim 9, further comprising the steps of: (i) detaching the latching members from the second rack, (ii) providing a third rack, (iii) aligning the top portion of each guide post with a respective round hole defined in a third rack so that the top portion of each guide post enters and fills a round hole of the third rack while its proximal locator wall cannot enter the same respective round hole, (iv) applying a force sufficient to detachably engage the latching members with respect to the third rack, (v) detaching the latching members from the third rack, (vi) providing a fourth rack, (vii) aligning each permanent and non-removable locator wall and its proximal guide post with a respective square hole defined in the fourth rack so that each locator wall and its proximal guide post enter the same respective square hole, and (viii) applying a force sufficient to detachably engage the latching members of the panel body with respect to the fourth rack.

11. The method of claim 9, wherein the top portion of each guide post is cylindrical;

wherein each guide post includes a rectangular base portion, with its cylindrical top portion extending from the rectangular base portion; and wherein each permanent and non-removable locator wall and the rectangular base portion of the guide post proximal to each locator wall enter the same respective square hole of the second rack when the locator walls and guide posts are aligned with holes of the second rack.

12. The method of claim 11, wherein the cylindrical top portion of each guide post enters and fills a round hole of the first rack when the guide posts are aligned with holes of the first rack.

13. The method of claim 9, further comprising removing the panel body from the first rack by:

applying a force to a finger hold associated with the panel body sufficient to remove the panel body from the first rack.

14. A latching assembly for a filler panel, comprising:

a panel body that extends from a first end to a second end, the first end including a first latch member defining a hood portion that includes a first angled, stepped surface and a second latch member defining a hood portion that includes a second angled, stepped surface different from and separated from the first stepped surface by a first slot; and a third latch member positioned at the first end of the panel body, the third latch member separated from the second latch member by a second slot, the third latch member defining a hood portion that includes a third angled, stepped surface that is substantially the same as the first angled, stepped surface defined by the first latch member;

wherein the first stepped surface is capable of detachably engaging a first railing of a rack, the first railing having a first thickness dimension; and wherein the second stepped surface is capable of detachably engaging a second railing of a rack, the second railing having a second thickness dimension different than the first thickness dimension.

15. A filler panel, comprising:

a panel body that includes: (i) two or more latching members, each defining a hood portion, wherein each hood portion includes an angled, stepped latching surface, (ii) two or more guide posts, each guide post including a cylindrical top portion, and (iii) a permanent and non-removable locator wall positioned proximal to and spaced from each guide post by an open slot, each permanent and non-removable locator wall fixedly attached to the panel body;

wherein the cylindrical top portion of each guide post extends further from the panel body than its proximal locator wall extends from the panel body;

wherein the angled, stepped latching surface of the hood portion is disposed relative to the panel body and capable of securely and detachably engaging a plurality of racks that are characterized by differing mounting rail thicknesses;

wherein the cylindrical top portion of each guide posts is configured to enter and fill a round hole associated with a first railing and guide at least one of the latching members to engage the first railing while its proximal locator wall cannot enter the same respective round hole;

wherein a second railing defines a plurality of square holes; and wherein after each guide post has entered a round hole associated with the first railing and thereafter removed from each respective round hole, then each permanent and non-removable locator wall and its proximal guide post are both configured to enter the same respective square hole defined in the second railing and to guide at least one of the latching members to engage the second railing.

16. The filler panel of claim 15, wherein the angled, stepped latching surface associated with each hood portion defines a plurality of stepped surfaces;

wherein the plurality of stepped surfaces of each hood portion includes at least a first stepped surface and a second stepped surface;

wherein the first stepped surface of each hood portion is capable of securely and detachably engaging the first railing of a rack;

wherein the second stepped surface of each hood portion is capable of securely and detachably engaging the second railing of a rack;

wherein the mounting rail thickness of the first railing is different than the mounting rail thickness of the second railing;

wherein each guide post includes a rectangular base portion, with its cylindrical top portion extending from the rectangular base portion; and wherein each permanent and non-removable locator wall and the rectangular base portion of the guide post proximal to each permanent and non-removable locator wall enter the same respective square hole of the second railing.

* * * * *